(12) United States Patent
Walczyk et al.

(10) Patent No.: US 8,891,235 B2
(45) Date of Patent: Nov. 18, 2014

(54) THERMAL INTERFACE FOR MULTI-CHIP PACKAGES

(75) Inventors: Joseph F. Walczyk, Tigard, OR (US); Jin Yang, Portland, OR (US); James G. Maveety, Campbell, CA (US); Todd P. Albertson, Warren, OR (US); Ashish Gupta, Chandler, AZ (US); Jin Pan, Portland, OR (US); Arun Krishnamoorthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 242 days.

(21) Appl. No.: 13/539,279

(22) Filed: Jun. 29, 2012

(65) Prior Publication Data

US 2014/0002994 A1    Jan. 2, 2014

(51) Int. Cl.
*H05K 7/20* (2006.01)
*F28F 9/007* (2006.01)

(52) U.S. Cl.
CPC ............... *F28F 9/007* (2013.01); *H05K 7/205* (2013.01)

USPC ...... 361/679.53; 361/689; 361/690; 361/699; 361/704; 165/80.3; 165/80.4; 257/712; 257/713; 257/714

(58) Field of Classification Search
None
See application file for complete search history.

(56) References Cited

U.S. PATENT DOCUMENTS

| | | | | |
|---|---|---|---|---|
| 5,306,866 A | * | 4/1994 | Gruber et al. | 174/15.1 |
| 5,323,292 A | * | 6/1994 | Brzezinski | 361/689 |
| 6,212,074 B1 | * | 4/2001 | Gonsalves et al. | 361/717 |
| 6,587,345 B2 | * | 7/2003 | Chu et al. | 361/719 |
| 6,690,578 B2 | * | 2/2004 | Edelmann | 361/699 |
| 6,809,930 B2 | * | 10/2004 | Mueller et al. | 361/704 |
| 6,940,712 B2 | * | 9/2005 | Chu et al. | 361/679.47 |
| 7,694,723 B2 | * | 4/2010 | Ma et al. | 165/80.4 |
| 7,978,473 B2 | * | 7/2011 | Campbell et al. | 361/699 |
| 8,115,302 B2 | * | 2/2012 | Andry et al. | 257/713 |

* cited by examiner

*Primary Examiner* — Boris Chervinsky
(74) *Attorney, Agent, or Firm* — Blakely, Sokoloff, Taylor & Zafman LLP

(57) ABSTRACT

A thermal interface unit includes a pedestal, a first contact surface below the pedestal to interface with a first die and a flat spring to enable the first contact surface to adapt to a variable height of a first die of a multi-chip package (MCP).

30 Claims, 7 Drawing Sheets

100

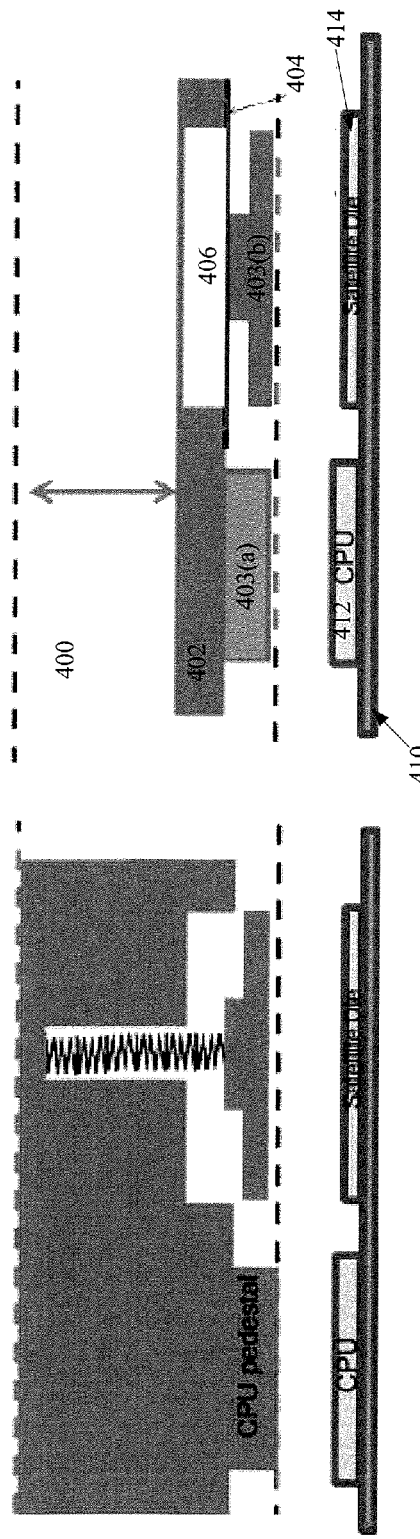
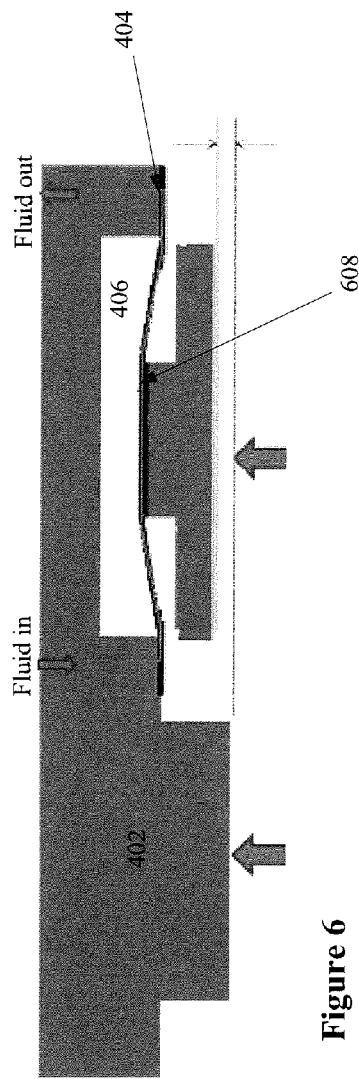
Figure 3
(Prior Art)
Figure 4
Figure 6

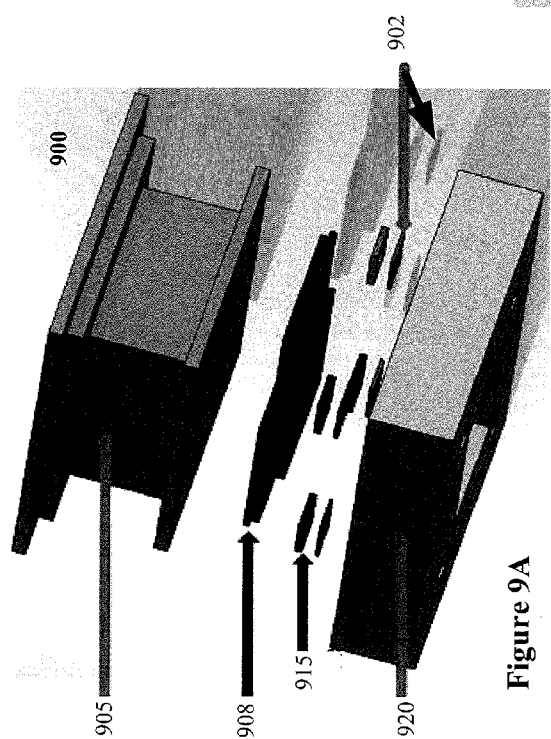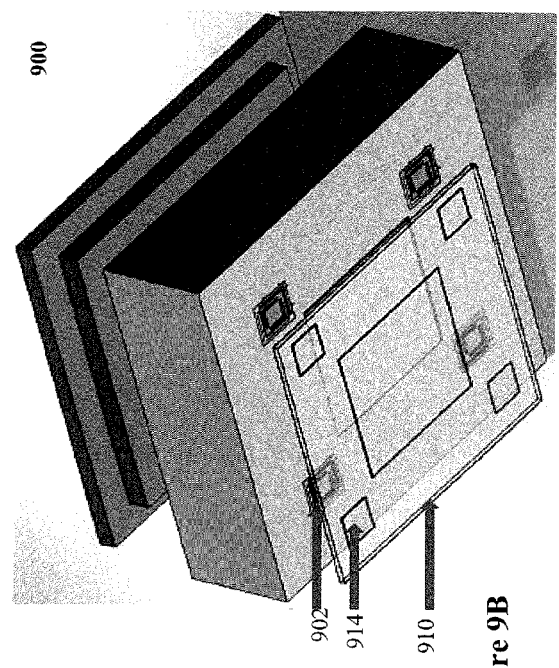
Figure 9A
Figure 9B

THERMAL INTERFACE FOR MULTI-CHIP PACKAGES

FIELD OF THE INVENTION

The present disclosure generally relates to integrated circuits, and more particularly, to testing integrated circuits.

BACKGROUND

Integrated circuits are designed to operate under a variety of environmental conditions. For example, integrated circuits are designed to operate over a range of temperatures. To ensure that an integrated circuit operates correctly over a particular range of temperatures, the integrated circuit is coupled to a test unit for testing at different temperatures within the particular range. The test unit typically includes a thermal unit that facilitates thermal cooling and control for testing.

However, multi-chip electronic packages (MCPs) create a challenge of testing using conventional thermal units. An MCP includes multiple die, which may comprise logic die, memory die, platform control hub (PCH), and/or digital die, attached or assembled on a substrate. FIGS. 1A and 1B illustrate a top view and a side view, respectively, of one embodiment of a three die MCP.

The problem with testing MCPs using conventional thermal units is an inability to simultaneously establish good mechanical and thermal contacts with each die due to a difference of die heights, a variation in height difference between each die, and warping of electronic packages. FIGS. 2A and 2B illustrate conventional thermal unit configurations for MCPs.

As shown in FIG. 2A, a rotating gimballing mechanism is included to accommodate die height difference. Nevertheless, the existing gimballing mechanism does not provide for sufficient contact across the entire die surfaces, which results in poor thermal cooling and control. FIG. 2B illustrates a three-die MCP in which an offset between the thermal unit and the nominal die height of two of the die creates an area of poor or non-contact.

FIG. 3 illustrates a conventional coil spring mechanism implemented to eliminate the height offset. However, as shown in FIG. 3 this mechanism, as well as the gimballing mechanism, requires large thermal unit profiles to eliminate the height offset.

An additional problem with testing MCPs using conventional thermal units is that inadequate contact coverage between the thermal unit pedestal and die may lead to over stressing and overheating of the die. Even when an interface material is applied, the die-pedestal gap may be large enough to drive over heating.

Currently, in order to compensate for inadequate die-pedestal contact coverage, the test program is changed (e.g., reducing the test power and extending the test time) in order to eliminate die damaged at test. These test program adjustments are undesirable because they often lead to longer test times.

BRIEF DESCRIPTION OF THE DRAWINGS

FIG. 3 illustrates a conventional coil spring mechanism.

FIG. 4 illustrates one embodiment of a thermal unit.

FIG. 6 illustrates another embodiment of a thermal unit.

FIGS. 9A and 9B illustrate one embodiment of a thermal interface module.

DETAILED DESCRIPTION

Figure 1A:
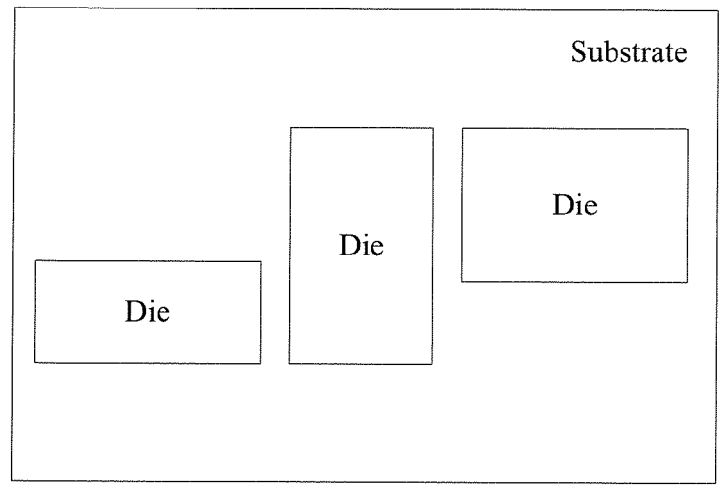
FIGS. 1A and 1B illustrate one embodiment of a three die MCP.
Figure 1B:
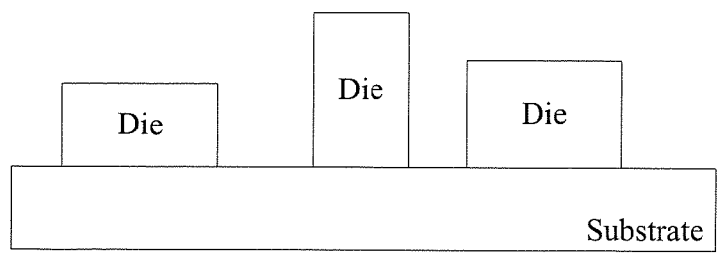
Figure 2A:
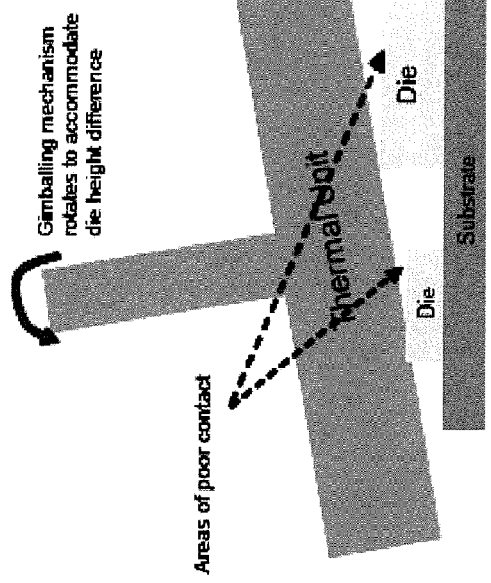
FIGS. 2A and 2B illustrate conventional thermal unit configurations for MCPs.
Figure 2B:
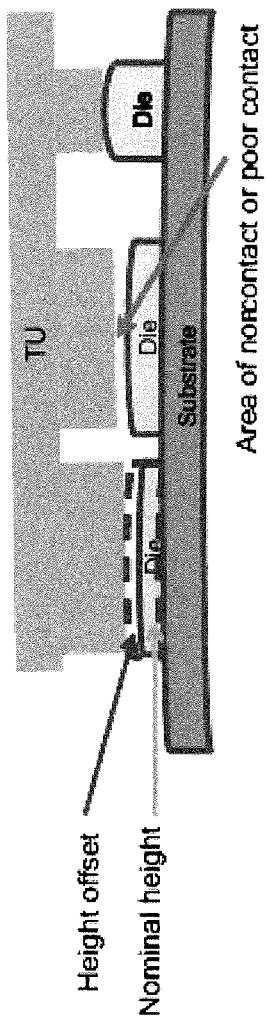

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

FIG. 4 illustrates one embodiment of a thermal interface unit 400 for interfacing with CPU die 412 and satellite die 414 during testing of MCP 410. According to one embodiment, thermal interface unit 400 is a mechanical assembly implemented as a reference heat spreading interface to provide an integrated interface and cooling path targeted for one or more satellite die on MCP 410. Thermal interface unit 400 includes a pedestal 402 having contact surfaces 403, a flat spring 404 and a fluid channel 406. In one embodiment, contact surface 403(a), flat spring 404 and fluid channel 406 comprise a thermal interface module.

In one embodiment, contact surfaces 403(a) and 403(b) are heat spreaders that couple to die 412 and 414 of MCP 410, respectively. Flat spring 404 is coupled above contact surface 403(b) and provides contact force to satellite die 414. According to one embodiment, spring 404 enables contact surface 403(b) to adapt to variable height contact surfaces of die 414 while maintaining a low profile.

Figures 5A, 5B:
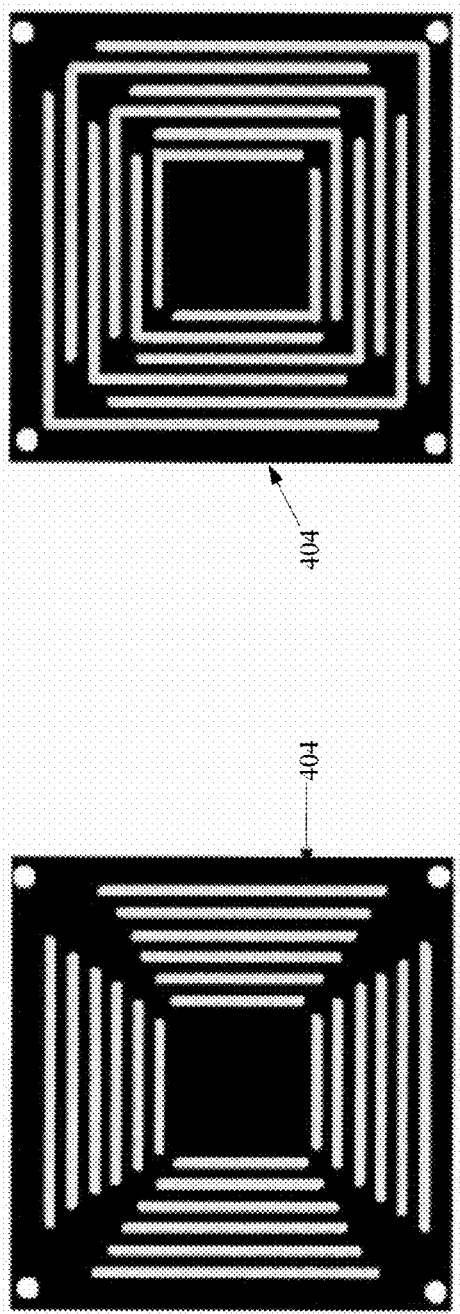
FIGS. 5A and 5B illustrate embodiments of a flat spring.

Spring 404 may include various materials (e.g., aluminum alloy, stainless steel, nickel-cobalt alloy, or other materials for flex film and spring manufacturing designs) and geometries. Various spring designs may be implemented to optimize the spring force required to match application forces (e.g., between 5-30 lbs). FIGS. 5A and 5B illustrate embodiments of flat spring 404 geometries. In a further embodiment, additional components, such as a normal flow heat sink, may be included in flat spring 404 to increase the cooling capability of thermal unit 400.

Referring back to FIG. 4, fluid channel 406 is embedded within pedestal 402 and supported by flat spring 404. Fluid channel 406 is provided to cool satellite die 414 by enabling the flow of a cooling fluid in and out of pedestal 402 to passively remove heat from the low satellite die 414 of MCP in test. In the rest position, as shown in FIG. 4, before loading is applied to the pedestal 402, flat spring remains in a flat position.

However, when loading from satellites die 414 is applied to flat spring 404 during testing, flat spring 404 would compresses to compensate for the height difference between die 412 and 414. Upon compression of flat spring 404, the decoupled fluidic channel 406 serves as thermal cooling path to die 414. FIG. 6 illustrates one embodiment of thermal unit 400 upon loading from satellites die 414. As shown in FIG. 6, flat spring 404 also includes a fluid channel 608. In one embodiment, cooling fluid flows through channel 608 when flat spring 404 is compressed. However in other embodiments, flat spring 404 may operate independently such that fluid only enters and exits flat spring 404 without passing through pedestal 402.

Figure 7:
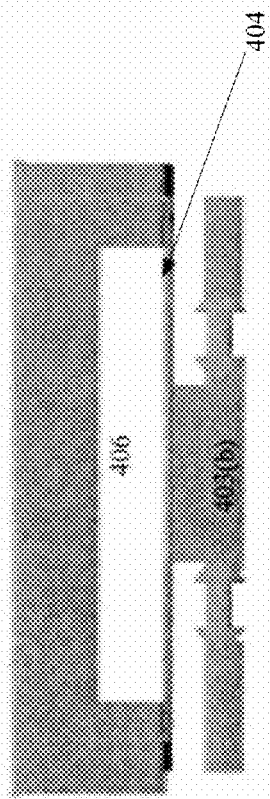
FIG. 7 illustrates one embodiment of a pedestal contact area.

In other embodiments, pedestal 402 may also include various material and geometrical designs. For instance, pedestal 402 may be comprised of copper or alloys that increase thermal conductivities to improve heat spreading. In a further embodiment, the geometry of pedestal 402 may be scaled to fit into various products. Thus, the contact area 403 area is configurable to meet different applications. FIG. 7 illustrates one embodiment of an alternative pedestal 402 configuration. As shown in FIG. 7, contact area 403 has a variable surface area to contact with a die 414.

Figure 8A:
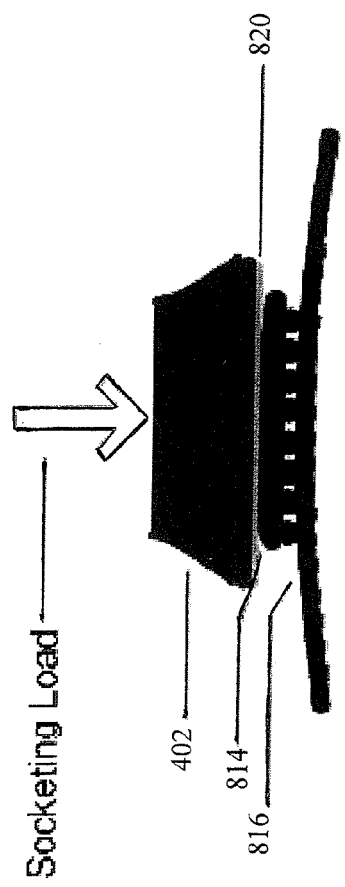
FIGS. 8A and 8B illustrate embodiments of a thermal unit pedestal.
Figure 8B:
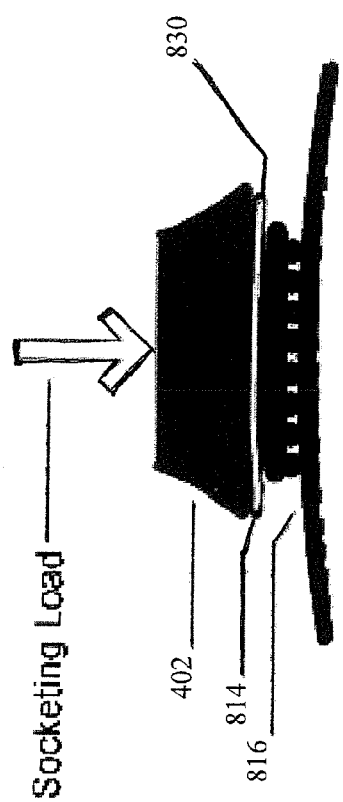

In further embodiments, pedestal 402 includes additional features to control contact with a MCP 410 die. FIGS. 8A and 8B illustrate such pedestal 402 embodiments. Each embodiment includes pedestal 402 contacting a die 814 on a MCP substrate 816. Additionally, each design includes a contact area for interfacing with die 814.

In FIG. 8A, a contact area 820 includes a Beryllium-Copper (Be—Cu) or Nickel-interface for contacting the die. However other materials (e.g., Nickel-Titanium (Nitinol)) may be implemented for the interface. In this embodiment, contact area 820 yields elastically to conform to the irregular die 814 surface in order to increase the pedestal-die contact surface.

In FIG. 8B, contact area 830 includes a thin-film Be—Cu or Nitinol contacting surface. Contact area 830 also includes a cavity behind the thin film that is filled with liquid metal to enhance heat transfer to pedestal 402, while providing al negligible contact resistant interface between the compliant interface and pedestal body.

In both embodiments, the pedestal 402 design includes an elastically yielding contact surface that leverages the unique mechanical and thermal properties of Nitinol and the softer Be—Cu alloy for enhancing die-pedestal contact. The improved contact ensures that minimum force is needed for testing.

FIGS. 9A and 9B illustrate one embodiment of a thermal interface module 900 in the above-described flat spring based thermal interface may be implemented. Referring to FIG. 9A, module 900 includes a thermal head 905, main pedestal 908, retainers 915 and holder 920, in addition to a multitude of thermal interface units 902. Retainers 915 are provided to constrain a respective thermal interface unit 902. FIG. 9B illustrates the thermal interface module 900 interfaced with a MCP 910, where each thermal interface unit 902 is matched with a die 914 on MCP 910.

Figure 10:
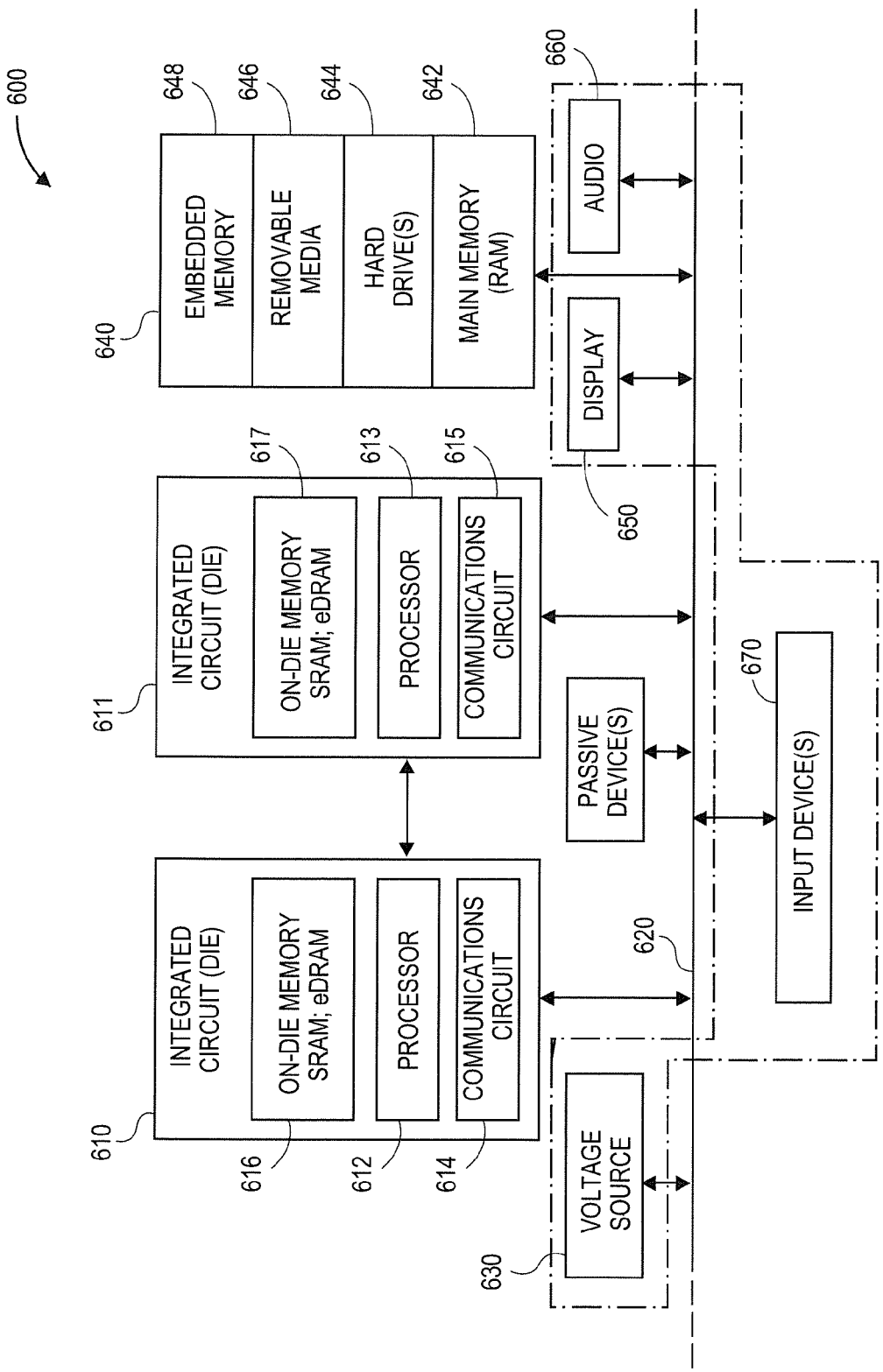
FIG. 10 illustrates one embodiment of a computer system.

FIG. 10 is a schematic of a computer system 600, in accordance with an embodiment of the present invention. The computer system 600 (also referred to as the electronic system 600) as depicted can embody a thermal interface unit that includes a pedestal, a first contact surface below the pedestal to interface with a first die and a flat spring to enable the first contact surface to adapt to a variable height of a first die of a multi-chip package (MCP) according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes a semiconductor die packaged with a thermal interface unit that includes a pedestal, a first contact surface below the pedestal to interface with a first die and a flat spring to enable the first contact surface to adapt to a variable height of a first die of a multi-chip package (MCP), as disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a semiconductor die packaged with a thermal interface unit that includes a pedestal, a first contact surface below the pedestal to interface with a first die and a flat spring to enable the first contact surface to adapt to a variable height of a first die of a multi-chip package (MCP) according to any of the several disclosed embodiments and their equivalents, an electronic system, a computer system, one or more methods of fabricating an integrated circuit, and one or more methods of fabricating an electronic assembly that includes a semiconductor die packaged according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 10. Passive devices may also be included, as is also depicted in FIG. 10.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A thermal interface unit, comprising:
   a pedestal;
   a first contact surface below the pedestal to interface with a first die; and
   a flat spring to enable the first contact surface to adapt to a variable height of a first die of a multi-chip package (MCP).

2. The thermal interface unit of claim 1 further comprising a fluid channel embedded in the pedestal above the flat spring to enable a flow of cooling fluid through the pedestal to remove heat from the first die.

3. The thermal interface unit of claim 2 wherein the flat spring comprises a fluid channel to enable the cooling fluid to flow through the pedestal and the flat spring.

4. The thermal interface unit of claim 3 wherein the flat spring includes a heat sink to increase cooling capacity.

5. The thermal interface unit of claim 2 further comprising a second contact surface below the pedestal to interface with a second die of the MCP.

6. The thermal interface unit of claim 5 wherein the first die has a first height and the second die has a second height different from the first height.

7. The thermal interface unit of claim 6 wherein the flat spring compresses to compensate for the difference between the first height and the second height.

8. The thermal interface unit of claim 5 wherein the first and second contact surfaces are heat spreaders.

9. The thermal interface unit of claim 5 wherein the first die is a satellite die and the second die is a central processing unit (CPU) die.

10. The thermal interface unit of claim 2 further comprising:
    a third contact surface below the pedestal to interface with a third die;
    a second flat spring to enable the third contact surface to adapt to a variable height of the third die of the MCP; and
    a second fluid channel embedded in the pedestal above the second flat spring.

11. A thermal interface module comprising:
    a thermal head;
    a first thermal interface unit, including:
        a pedestal;
        a first contact surface below the pedestal to interface with a first die; and
        a flat spring to enable the first contact surface to adapt to a variable height of a first die of a multi-chip package (MCP); and
    a first retainer to constrain the first thermal interface unit.

12. The thermal interface module of claim 10 wherein the first thermal interface unit further comprises a fluid channel embedded in the pedestal above the flat spring to enable a flow of cooling fluid through the pedestal to remove heat from the first die.

13. The thermal interface module of claim 12 wherein the flat spring comprises a fluid channel to enable the cooling fluid to flow through the pedestal and the flat spring.

14. The thermal interface module of claim 13 wherein the flat spring includes a heat sink to increase cooling capacity.

15. The thermal interface module of claim 13 wherein the first thermal interface unit further comprises a second contact surface below the pedestal to interface with a second die of the MCP.

16. The thermal interface module of claim 15 wherein the first die has a first height and the second die has a second height different from the first height.

17. The thermal interface module of claim 16 wherein the flat spring compresses to compensate for the difference between the first height and the second height.

18. The thermal interface module of claim 15 wherein the first die is a satellite die and the second die is a central processing unit (CPU) die.

19. The thermal interface module of claim 13 further comprising:
    a second thermal interface unit, including:
        a third contact surface below the pedestal to interface with a third die;
        a second flat spring to enable the third contact surface to adapt to a variable height of the third die of the MCP; and
        a second fluid channel embedded in the pedestal above the second flat spring
    a second retainer to constrain the second thermal interface unit.

20. A thermal interface unit, comprising:
    a pedestal; and
    a contact surface below the pedestal including an interface to elastically yield to conform to an irregular surface on a die on a multi-chip package (MCP).

21. The thermal interface unit of claim 20 wherein the interface comprises a thin film contacting surface.

22. The thermal interface unit of claim 21 wherein the contact surface comprises a cavity behind the thin film contacting surface.

23. The thermal interface unit of claim 22 wherein the cavity is filled with a liquid metal to enhance heat transfer to the pedestal.

24. The thermal interface unit of claim 20 wherein the interface comprises a Beryllium-Copper material.

25. The thermal interface unit of claim 20 wherein the interface comprises a Nickel-Titanium material.

26. A system comprising:
    a multi-chip package (MCP) including:
        a first die having a first height; and
        a second die having a second height; and
    a thermal interface unit, comprising:
        a pedestal;

a first contact surface below the pedestal to interface with the first die;
    a first flat spring to enable the first contact surface to adapt to a variable height of the first die; and
a second contact surface below the pedestal to interface with the second die.

27. The system of claim 26 further comprising a fluid channel embedded in the pedestal above the flat spring to enable a flow of cooling fluid through the pedestal to remove heat from the first die.

28. The system of claim 26 wherein the first die has a first height and the second die has a second height different from the first height.

29. The system of claim 28 wherein the flat spring compresses to compensate for the difference between the first height and the second height.

30. The system of claim 26 wherein the first die is a satellite die and the second die is a central processing unit (CPU) die.

* * * * *